United States Patent
Hsiao et al.

(10) Patent No.: US 11,244,822 B2
(45) Date of Patent: Feb. 8, 2022

(54) APPARATUS FOR MANUFACTURING A THIN FILM AND A METHOD THEREFOR

(71) Applicant: TAIWAN SEMICONDUCTOR MANUFACTURING CO., LTD., Hsinchu (TW)

(72) Inventors: Tsai-Fu Hsiao, Hsinchu (TW); Kuang-Yuan Hsu, Taichung (TW); Pei-Ren Jeng, Hsinchu (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 762 days.

(21) Appl. No.: 14/918,294

(22) Filed: Oct. 20, 2015

(65) Prior Publication Data

US 2017/0110312 A1    Apr. 20, 2017

(51) Int. Cl.
| | |
|---|---|
| *C23C 16/455* | (2006.01) |
| *H01L 21/687* | (2006.01) |
| *H01L 21/677* | (2006.01) |
| *H01L 21/67* | (2006.01) |
| *C23C 16/54* | (2006.01) |
| *H01L 21/02* | (2006.01) |

(52) U.S. Cl.
CPC ........ *H01L 21/0228* (2013.01); *C23C 16/455* (2013.01); *C23C 16/45551* (2013.01); *C23C 16/45593* (2013.01); *C23C 16/54* (2013.01); *H01L 21/0217* (2013.01); *H01L 21/02164* (2013.01); *H01L 21/02208* (2013.01); *H01L 21/6776* (2013.01); *H01L 21/67161* (2013.01); *H01L 21/67173* (2013.01); *H01L 21/67754* (2013.01); *H01L 21/68764* (2013.01); *H01L 21/68771* (2013.01); *C23C 16/45561* (2013.01)

(58) Field of Classification Search
None
See application file for complete search history.

(56) References Cited

U.S. PATENT DOCUMENTS

| | | | |
|---|---|---|---|
| 4,525,389 A * | 6/1985 | Stemmler | C23C 16/45593 427/249.17 |
| 2001/0007244 A1* | 7/2001 | Matsuse | C23C 16/45519 118/719 |

(Continued)

FOREIGN PATENT DOCUMENTS

CN          101406108 A        4/2009

*Primary Examiner* — Karla A Moore
(74) *Attorney, Agent, or Firm* — McDermott Will & Emery LLP

(57) ABSTRACT

An apparatus includes a vacuum chamber, a wafer transfer mechanism, a first gas source, a second gas source and a reuse gas pipe. The vacuum chamber is divided into at least three reaction regions including a first reaction region, a second reaction region and a third reaction region. The wafer transfer mechanism is structured to transfer a wafer from the first reaction region to the third reaction region via the second reaction region. The first gas source supplies a first gas to the first reaction region via a first gas pipe, and a second gas source supplies a second gas to the second reaction region via a second gas pipe. The reuse gas pipe is connected between the first reaction region and the third reaction region for supplying an unused first gas collected in the first reaction region to the third reaction region.

20 Claims, 6 Drawing Sheets

(56) References Cited

U.S. PATENT DOCUMENTS

| | | | |
|---|---|---|---|
| 2004/0052972 A1* | 3/2004 | Schmitt | C23C 16/4412 427/569 |
| 2007/0224348 A1* | 9/2007 | Dickey | C23C 16/45551 427/248.1 |
| 2007/0281089 A1* | 12/2007 | Heller | C23C 16/45514 427/255.5 |
| 2014/0127404 A1* | 5/2014 | Yudovsky | C23C 16/4412 427/248.1 |
| 2017/0281089 A1 | 10/2017 | Oz et al. | |

* cited by examiner

APPARATUS FOR MANUFACTURING A THIN FILM AND A METHOD THEREFOR

TECHNICAL FIELD

The disclosure relates to an apparatus for manufacturing a thin film, and more particularly to an apparatus for an atomic layer deposition (ALD) to fabricate a thin film in semiconductor device manufacturing process.

BACKGROUND

As the semiconductor industry has progressed into nanometer technology process nodes in pursuit of higher device density, higher performance, and lower costs, various thin film formation technologies have been developed. An atomic layer deposition (ALD) is one of such film formation technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
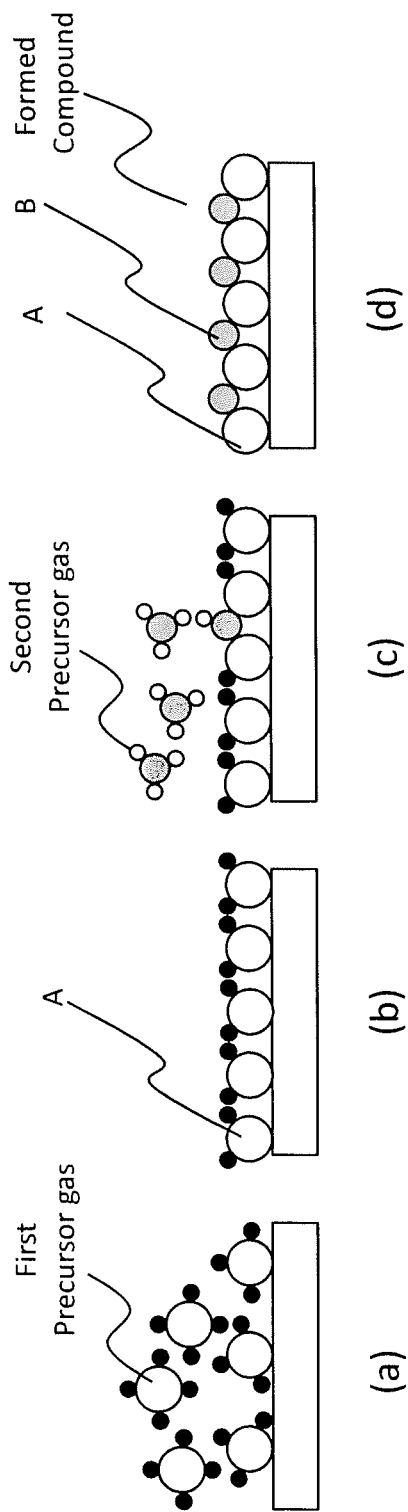
FIG. 1 shows a general concept of an ALD method.

FIG. 1 shows a general concept of a thin film formation using an ALD method. Operations for forming a thin film (for example, metal nitride) by the ALD method are as follows. Vaporizing a first precursor material (including element A) and providing the vaporized first precursor material (first precursor gas) gas onto a substrate placed in a vacuum chamber, as shown in FIG. 1(a). The first precursor gas (molecules) absorbs on the wafer and is decomposed, for example, thermally, in the wafer surface, thereby creating a mono-atomic layer comprising element A on the substrate. Then a purge gas is introduced to purge an unnecessary portion of the source gas, as shown in FIG. 1(b). Next, a second precursor gas (reactive gas) including element B is introduced onto the surface of the wafer such that the second precursor gas (element B) reacts with the mono-atomic layer of element A, as shown in FIG. 1(c). A purge gas is again introduced to purge an unnecessary portion of the reactive gas, and a single layer of a compound of a reaction product of elements A and B is formed, as shown in FIG. 1(d). The operations of FIGS. 1(a) to 1(d) are repeated to form a thin film of the compound with a desired thickness. The ALD method has a feature that a layer can be conformally grown over a projection or into a small hole/recess with a high aspect ratio, because the layer is grown for each mono-atomic layer.

Figure 2:
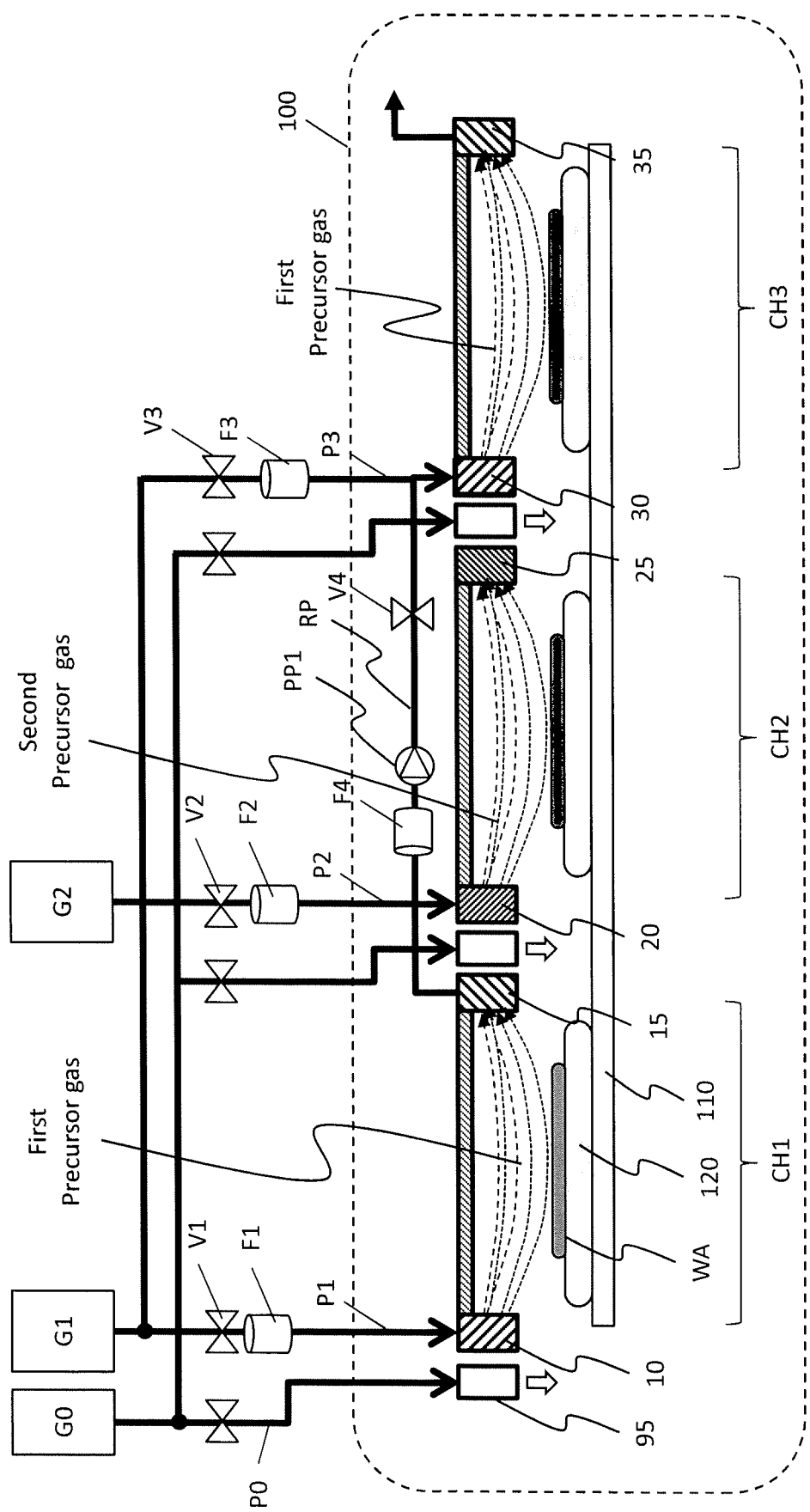
FIG. 2 shows an exemplary schematic diagram illustrating an apparatus for an ALD according to one embodiment of the present disclosure.

FIG. 2 shows an exemplary schematic diagram illustrating an apparatus for an ALD (an ALD apparatus) according to one embodiment of the present disclosure.

The ALD apparatus includes a vacuum chamber 100 with a pumping system (not shown) to maintain the pressure inside the vacuum chamber at a desired level.

The vacuum chamber 100 is divided into several reaction regions including, for example, a first reaction region CH1, a second reaction region CH2 and a third reaction region CH3. The reaction regions CH1, CH2 and CH3 are arranged in this order. Of course, the number of reaction regions is not limited to three. It may be four or more, and may be eight, in some examples.

The reaction regions may be separated by a physical wall or may be separated by an air curtain using a non-reactive gas (inert gas) supplied from a non-reactive gas source G0 via a gas pipe P0. Examples of the non-reactive gas include He, Ar and/or $N_2$. The non-reactive gas for air curtain is provided from injection ports 95 to regions between adjacent reaction regions, so that a gas in one reaction region does not diffuse into the adjacent reaction region. The gas pipe P0 may include a flow regulator and/or a valve.

In the vacuum chamber 100, a wafer transfer mechanism 110 for transferring a wafer WA (or a substrate) placed on a wafer stage 120 from the first reaction region CH1 to the third reaction region CH3 via the second reaction region CH2. The wafer transfer mechanism 110 transfers the wafer WA in a continuous manner (with a constant speed) or a stepwise manner. The wafer transfer mechanism 110 may include a conveyor, a robot, a spin-wheel and/or other wafer transfer mechanisms/systems known in the industry. The wafer transfer mechanism 110 may transfer the wafer WA together with the wafer stage 120 or may transfer wafer WA only.

The ALD apparatus further includes a first gas source G1 for supplying a first gas containing a first precursor as an active component to the first reaction region CH1 and the third reaction region CH3 via gas pipes P1 and P3 and a second gas source G2 for supplying a second gas containing a second precursor as an active component to the second reaction region CH2 via a gas pipe P2. Each of the gas pipes P1, P2 and P3 may include flow regulators F1, F2 and F3 and/or valves V1, V2 and V3, respectively. Further, a gas source for supplying a purge gas, for example, the non-reactive gas, is also provided to purge the excess first/second gases from the wafer.

The first reaction region CH1 is provided with a gas injection port 10 connected to the gas pipe P1 for supplying the first gas to the wafer WA when the wafer is located in the first reaction region CH1 and a gas suction port 15 for evacuating an unused first gas, which was not used in the ALD deposition in the first reaction region CH1.

Similarly, the second reaction region CH2 is provided with a gas injection port 20 connected to the gas pipe P2 for supplying the second gas to the wafer WA when the wafer is located in the second reaction region CH2 and a gas suction port 25 for evacuting an unused second gas, which was not used in the ALD deposition in the second reaction region CH2. Further, the third reaction region CH3 is provided with a gas injection port 30 connected to the gas pipe P3 for supplying the first gas to the wafer WA when the wafer is located in the third reaction region CH3 and a gas suction port 35 for evacuating an unused first gas, which was not used in the ALD deposition in the third reaction region CH3.

The ALD apparatus further includes a reuse gas pipe RP connected between the gas suction port 15 of the first reaction region CH1 and the gas injection port 30 of the third reaction region CH3. The unused first gas collected in the first reaction region CH1 is supplied to the third reaction region CH3 via the reuse gas pipe RP. A gas transfer mechanism, such as a pump PP1, a flow regulator F4 and/or a valve V4 may be provided on the gas reuse pipe RP.

As shown in FIG. 2, the gas injection port 30 may be connected to the reuse gas pipe RP and the gas pipe P3, thereby supplying at least one of the unused first gas supplied from the first reaction region and a fresh first gas supplied from the gas source G1 to the wafer, when the wafer is located in the third reaction region CH3. By operations of the valves V3 and V4, one of or both of the unused first gas supplied and the fresh first gas can be supplied to the third reaction region. In some embodiments, the valves V3 and V4 may be replaced with a three-way valve.

Each of the first to third reaction regions is provided with a heater (not shown) for heating the wafer and the atmosphere around the wafer. The heater may be provided in the stage 120 in some embodiments. Further, a vacuum pumping system and a load-lock system are also provided in the ALD apparatus.

An ALD deposition by using the ALD apparatus of the present embodiment will be described.

A wafer WA is transferred into the first reaction region CH1 by the wafer transfer mechanism 110. In the first reaction region CH1, the first gas, for example, $SiH_4$, $Si_2H_6$ and/or $SiH_2Cl_2$, is supplied onto the surface of wafer WA. These gases may be diluted with non-reactive gases such as He, Ar and/or $N_2$. As described with FIGS. 1(a) and 1(b), a mono-atomic layer of Si is formed on the surface of wafer WA.

After the mono-atomic layer of Si is formed on the wafer WA, the wafer WA is transferred into the second reaction region CH2 by the wafer transfer mechanism 110. In the second reaction region CH2, the second gas, for example, $NH_3$ is supplied onto the surface of wafer WA. The gas may be diluted with non-reactive gases such as He, Ar and/or $N_2$.

As described with FIGS. 1(c) and 1(d), a first "atomic" layer of a compound between Si and N (silicon nitride) is formed on the surface of wafer WA.

Then, the wafer WA is further transferred into the third reaction region CH3 by the wafer transfer mechanism 110. The first gas is again supplied onto the surface of wafer WA, on which the first layer of silicon nitride has been formed. A mono-atomic layer of Si is formed on the first layer of silicon nitride.

Here, the gas supplied to the wafer in the third reaction region includes the unused first gas, which was not used in the ALD deposition in the first reaction region CH1. By re-using the unused gas collected from the first reaction region, it is possible to increase efficiency in use of the source gases and to reduce the cost for forming a thin film. For example, if the unused gas is not re-used, the efficiency in use of the gas is less than 0.1% (i.e., more than 99.9% of the gas is wasted). In contrast, by re-using the unused gas, the efficiency can be improved to more than 1%.

In addition, as set forth above, the gas injection port 30 is capable of supplying a fresh first gas supplied from the gas source G1. By operating the valve V3 and the flow regulator F3, a fresh first gas is added to the unused gas supplied from the first reaction region, thereby maintaining a concentration of an active component (precursor) in the first gas.

After the operation in the third reaction region CH3, the wafer WA is further transferred into a fourth reaction region (not shown), which has the similar configuration to the reaction region CH2, and the second gas is supplied onto the surface of wafer WA, thereby forming a second "atomic" layer of silicon nitride over the surface of wafer WA. If there are subsequent reaction regions, e.g., fifth, sixth, . . . , the ALD depositions using the first gas and the second gas are repeated. In the alternative, after the deposition in the fourth reaction region, the wafer WA may be returned to the first reaction region, and the ALD depositions using the first gas and the second gas may be repeated in the first to fourth reaction regions. In certain embodiments, the wafer WA may be transferred in the reverse direction from the fourth reaction region to the first reaction region after the ALD deposition in the fourth reaction region.

Further, in a similar manner to reusing the unused first gas collected in the first reaction region CH1 in the third reaction region CH3 in FIG. 2, an unused second gas may be collected in the second reaction region and supplied to the fourth reaction region in some embodiments.

As shown in FIG. 2, the gas injection ports, each including one or more gas injection nozzles, 10, 20 and 30 are located at a first end (e.g., an upstream end in the wafer transfer direction) of each reaction region and the gas suction ports 15, 25 and 35 are located at a second end (e.g., a downstream end of the wafer transfer direction) of each reaction region, in one embodiment. In certain embodiments, the first end may be the downstream end, and the second end may be the upstream end of the wafer transfer direction. With this configuration, it is possible to maintain the gas flow in parallel or with a low angle with respect to the surface of the wafer, which in turn makes it easier to collect the unused gas by the suction port. There may be plural gas injection ports and/or plural gas suction ports provided to one reaction regions.

Although in FIG. 2 the first reaction region CH1 for the first source gas and the second reaction region CH2 for the second source gas are adjacent to each other, there may be a buffer region between the first and second reaction region to purge extra first source gas by using an inert gas.

Figure 3A:
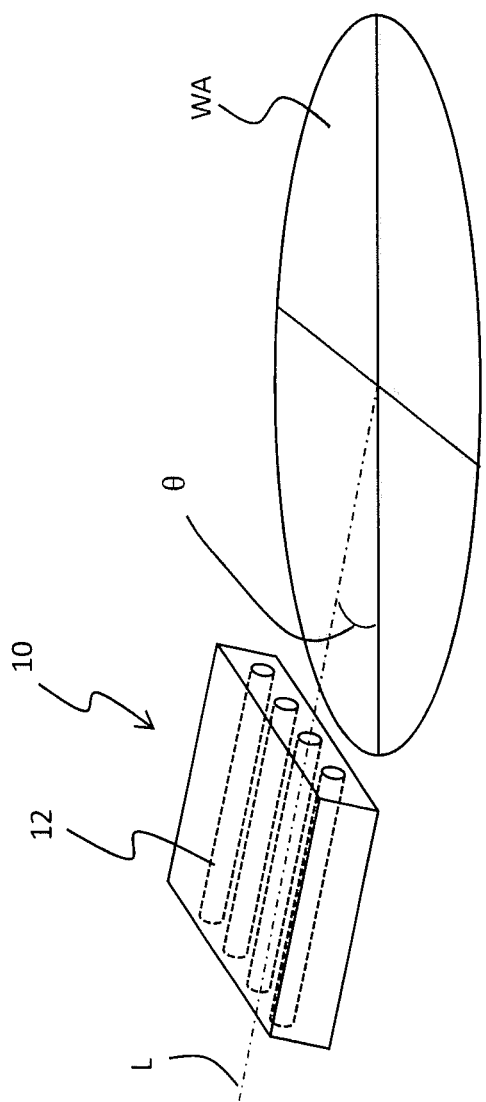
FIGS. 3A and 3B show an exemplary schematic diagram illustrating an angular relationship between gas nozzles and a wafer.

FIG. 3A shows an exemplary schematic diagram illustrating an angular relationship between gas nozzles and a wafer. For example, the gas injection port 10 includes a plurality of gas nozzles 12 arranged in the width direction of the gas injection port 10. The surface of the wafer WA and the direction in which the gas nozzles extend (line L) makes an angle θ as shown in FIG. 3A. In one embodiment, the angle θ is set in a range of about 0 degrees to about 20 degrees. In other embodiments, the angle θ may be set in a range of about 0 degrees to about 10 degrees.

Figure 3B:
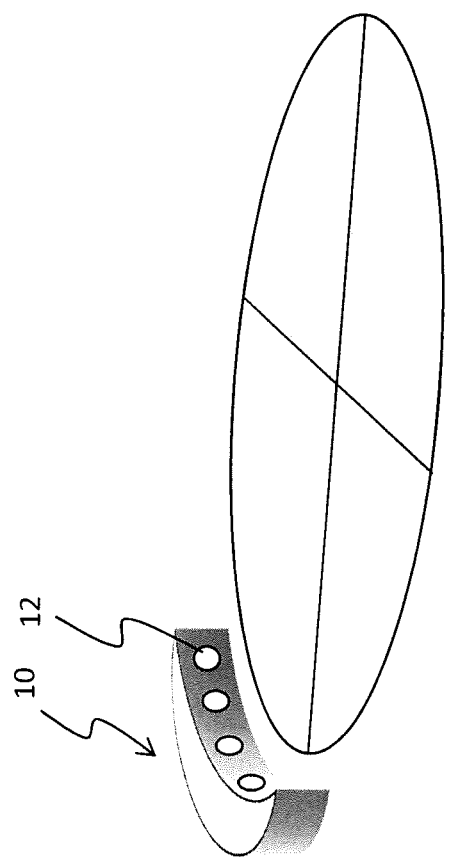

In some embodiments, as shown in FIG. 3B, the gas injection port 10 may have a curved outlet surface in which nozzles 12 are provided. The curvature may coincide with the curvature of the wafer.

In FIG. 2, the first and second reaction regions are arranged side-by-side in the horizontal direction. In other embodiment, the first and second reaction regions may be stacked along the vertical direction. In such a case, the wafer moves up and down by a vertical wafer transfer mechanism (for example, an up-down stage or a robot) and the air curtain gas horizontally provided between the first and second reaction regions may function as a purge gas.

Figure 5:
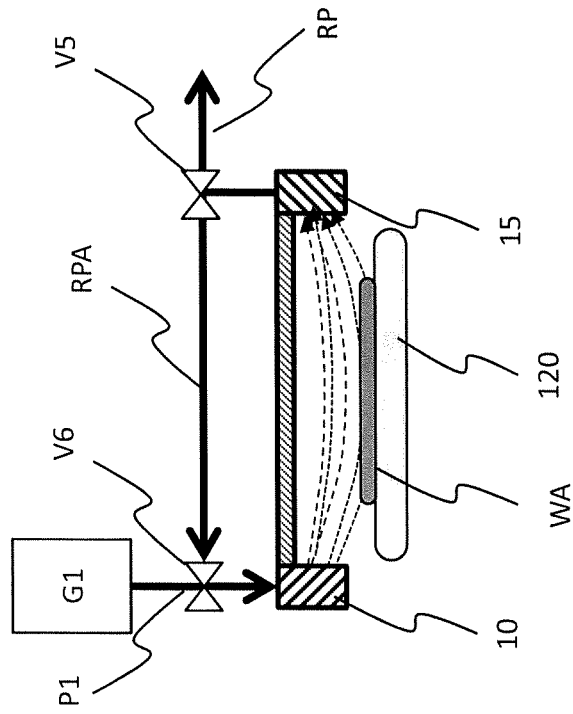
FIGS. 4 and 5 show an exemplary schematic diagram illustrating some variations of an apparatus for an ALD according to some embodiments of the present disclosure.
Figure 4:
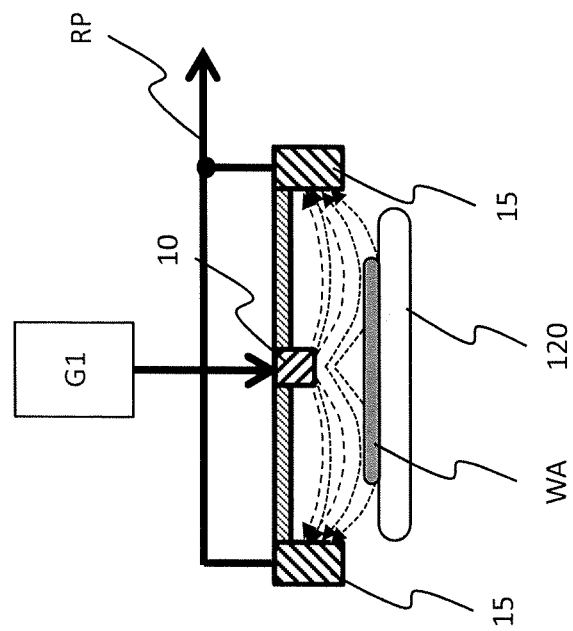

FIGS. 4 and 5 show an exemplary schematic diagram illustrating some variations of an apparatus for an ALD according to some embodiments of the present disclosure.

In FIG. 4, the gas injection port 10 is located at or near the center of the wafer WA or the wafer stage 120, and the gas suction portions 15 are located at or on the circumference of the wafer WA or the wafer stage 120. The suction port 15 may surround the wafer or the wafer stage, having a ring shape. Similar to FIG. 3A, the gas is supplied to the wafer at a low angle. The position of the suction port 15 and the gas injection port 10 may be interchanged.

In FIG. 5, an additional or an alternative reuse gas pipe RPA is provided within the reaction region (e.g., the first reaction region CH1). The additional reuse gas pipe RPA branches off from the reuse gas pipe RP at the valve V5, and is connected to the gas pipe P1 at the valve V6. With this configuration, it is possible to reuse the unused gas within the same reaction region, thereby improving the gas use efficiency. In some embodiments, the gas pipe RPA is an alternative to the reuse gas pipe RP.

Figure 6:
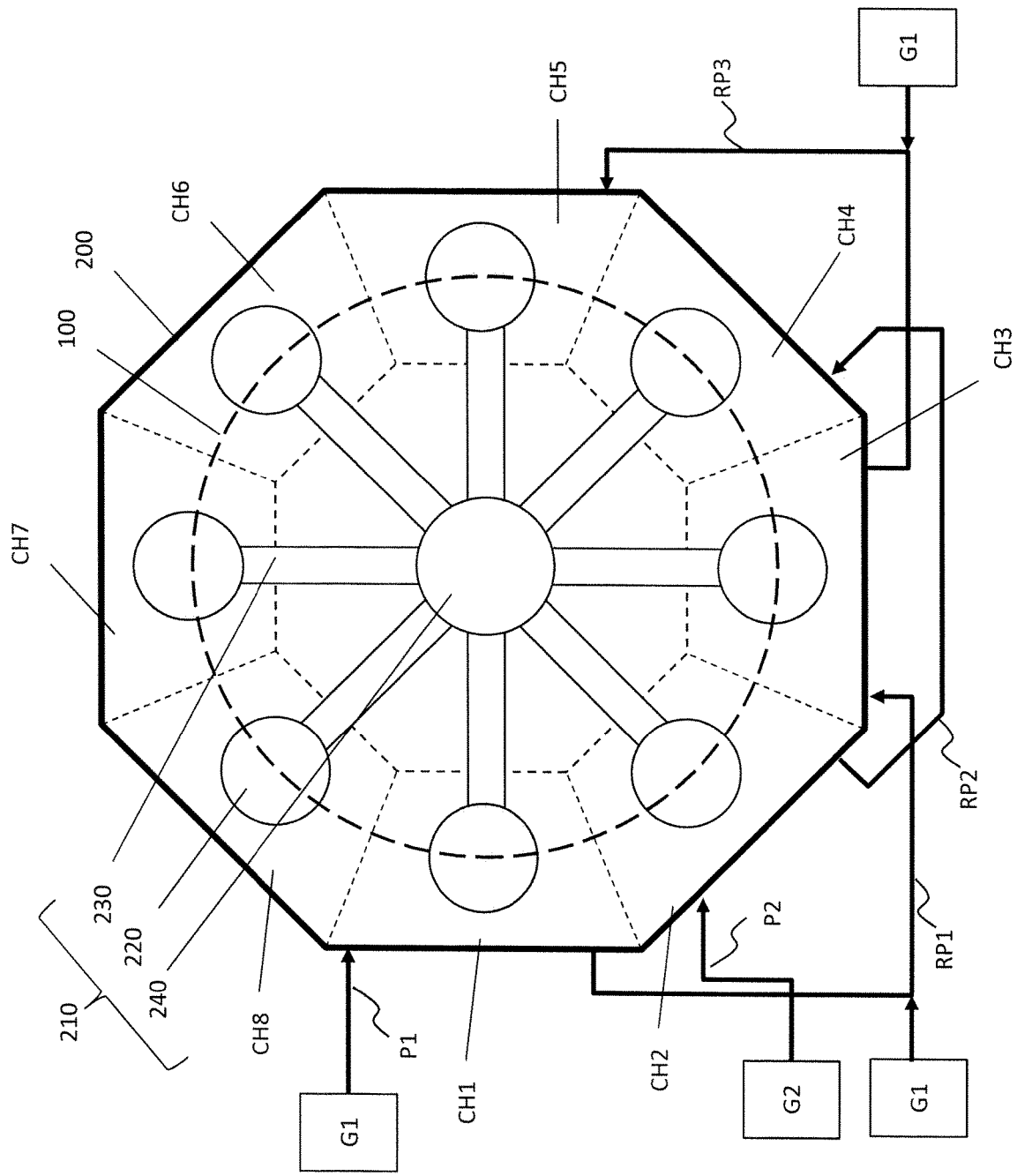
FIG. 6 shows an exemplary schematic diagram illustrating an apparatus for an ALD according to another embodiment of the present disclosure.

FIG. 6 shows an exemplary schematic diagram illustrating an apparatus for an ALD according to another embodiment of the present disclosure.

The ALD apparatus shown in FIG. 6 includes a vacuum chamber 200 divided into a plurality of reaction regions, for example, CH1 to CH8. The number of reaction regions may be even umbers such as 2, 4, 6, 12, 10, 14 or 16. The plurality of reaction regions are located on a circumference 210 of a circle. A wafer transfer mechanism 210 includes a plurality of wafer stages 220 each supported by arms 230 extending from a rotational driving mechanism 240 located at a center of the circle. The wafer transfer mechanism 210 transfers a wafer from one reaction region to an adjacent reaction region. Instead of arms, a wheel disc having plural wafer susceptors may be used. In other embodiments, one or more robotic arms having one or more joints may be employed to transfer a wafer from one reaction region to another reaction region. Further, a vacuum pumping system and a load-lock system are also provided in the ALD apparatus.

Similar to FIG. 2, a first gas source G1 for supplying a first gas is connected to the first reaction region CH1 via a gas pipe P1. A second gas source G2 for supplying a second gas is connected to the second reaction region CH2 via a gas pipe P2. A first reuse gas pipe RP1 connected between the first reaction region CH1 and the third reaction region CH3 for supplying an unused first gas collected in the first reaction region to the third reaction region. Further, the first gas may also be supplied to the third reaction region CH3 in a similar manner as shown in FIG. 2. Valves, flow controllers, gas curtain systems and gas injection/suction portions are also provided similar to FIG. 2. The same or similar structures of FIGS. 2-5 may be employed in the apparatus of FIG. 6.

In addition, a second reuse gas pipe RP2 may be provided between the second reaction region CH2 and a fourth reaction region CH4, and a third reuse gas pipe RP3 may be provided between the third reaction region CH3 and a fifth reaction region CH5. Further, additional reuse pipes may be provided between the fourth reaction region CH4 and a sixth reaction region CH6, between the fifth reaction region CH5 and a seventh reaction region CH7, between the sixth reaction region CH6 and a eighth reaction region CH8, and/or the seventh reaction region CH7 and the first reaction region CH1.

By rotating the arms 220 by the rotational driving mechanism 240, the stage 220 on which a wafer is placed, moves from one reaction region to the next reaction region. For example, a wafer placed on one stage 220 is processed in the first reaction region so that a mono-atomic layer of a first material (e.g., Si) is formed on the wafer. Then, by rotating the arms, the stage with the wafer moves to the second reaction region CH2, where a first "atomic" layer of a compound between the first material and a second material (e.g., N) is formed on the surface of the wafer. Next, the wafer is transferred to the third reaction region to eighth reaction regions to repeat the ALD deposition. If necessary, the wafer subsequently returns to the first reaction region CH1 and a formation of the mono-atomic layer of the first material is repeated.

In the above embodiment, two gases are used. In some embodiments, three or more kinds of gases may be used to form a multilayer thin film. For example, a multilayer film of silicon nitride and silicon oxide may be formed by using a Si containing gas (e.g., $SiH_4$, $Si_2H_6$ and/or $SiH_2Cl_2$), a nitrogen containing gas (e.g., $NH_3$) and a oxygen containing gas (e.g. $O_2$). The Si containing gas is supplied to the first, third, fifth and seventh reaction regions, while the nitrogen containing gas is supplied to second and sixth reaction region and the oxygen containing gas is supplied to the fourth and eighth reaction regions.

Although in FIG. 6 the first reaction region CH1 for the first source gas and the second reaction region CH2 for the second source gas are adjacent to each other, there may be a buffer region between the first and second reaction region to purge extra first source gas by using an inert gas.

Figure 7:
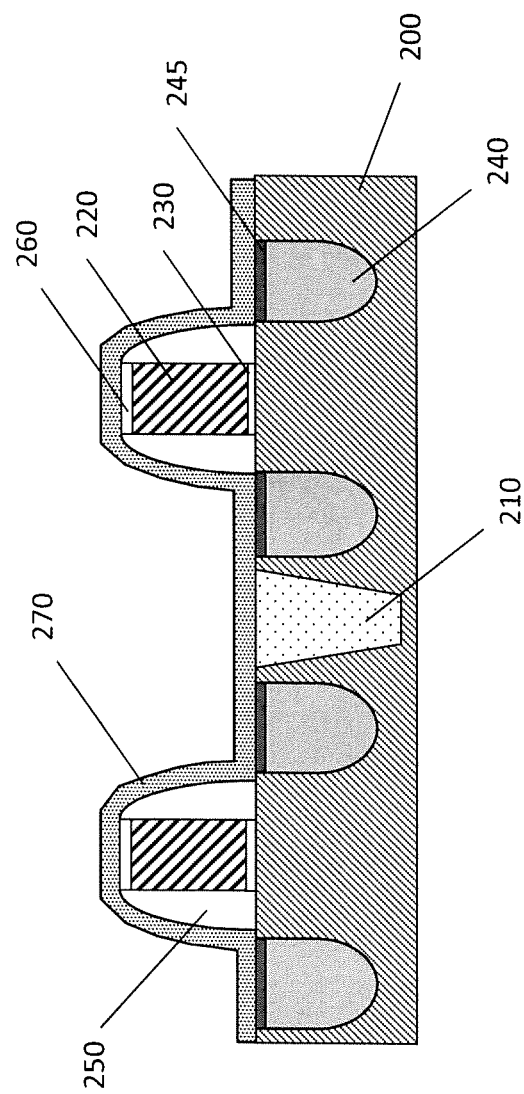
FIG. 7 shows one example of an application of the ALD apparatus/method to a semiconductor fabrication process according to one embodiment of the present disclosure.

FIG. 7 shows one example of an application of the ALD apparatus/method to a semiconductor fabrication process according to one embodiment of the present disclosure.

The ALD apparatus/method as set forth above may be applied to form a contact etching stop layer (CESL) in a MOS FET (metal-oxide-semiconductor field-effect-transistor) fabrication process. As shown in FIG. 7, MOS FETs, such as a Fin FET, are formed on the substrate 200. Two FETs may be isolated by an isolation region 210. The FET includes a gate electrode 220, a gate dielectric layer 230 and source/drain 240. The upper portion of the source/drain may have a silicide layer 245. Further, sidewall spacers 250 are provided on both side faces of the gate electrode 220. In some embodiments, a mask layer 260 may remain on the upper face of the gate electrode 220, which has been use to pattern the gate electrode.

A CESL 270 made of, for example, silicon nitride, is formed over the FETs. By using the ALD apparatus/method as set forth above, a blanket layer of silicon nitride can be conformally formed over the underlying structures with a low cost. Further, by using the ALD apparatus/method as set forth above, a multilayer CESL with desirable film properties may be formed.

The various embodiments described herein offer several advantages over the existing art. For example, in the present disclosure, since a precursor gas can be reused, it is possible to increase efficiency in use of the source gases and to reduce the cost for forming a thin film.

It will be understood that not all advantages have been necessarily discussed herein, no particular advantage is required for all embodiments, and other embodiments may offer different advantages.

In accordance with one aspect of the present disclosure, an apparatus includes a vacuum chamber, a wafer transfer mechanism, a first gas source, a second gas source and a reuse gas pipe. The vacuum chamber is divided into at least three reaction regions including a first reaction region, a second reaction region and a third reaction region. The wafer transfer mechanism is structured to transfer a wafer from the first reaction region to the third reaction region via the second reaction region. The first gas source supplies a first gas to the first reaction region via a first gas pipe, and a second gas source supplies a second gas to the second reaction region via a second gas pipe. The reuse gas pipe is connected between the first reaction region and the third reaction region for supplying an unused first gas collected in the first reaction region to the third reaction region.

In accordance with another aspect of the present disclosure, an apparatus includes a vacuum chamber, a wafer transfer mechanism, a first gas source, a second gas source and a reuse gas pipe. The vacuum chamber is divided into a plurality of reaction regions including a first reaction region, a second reaction region and a third reaction region. The plurality of reaction regions are located on a circumference of a circle. The wafer transfer mechanism includes a plurality of wafer stages located on the circumference of the circle, and the wafer transfer mechanism transfers a wafer from one reaction region to an adjacent reaction region. The first gas source for supplying a first gas is connected to the first reaction region via a first gas pipe, and the second gas source for supplying a second gas is connected to the second reaction region via a second gas pipe. The reuse gas pipe is connected between the first reaction region and the third reaction region for supplying an unused first gas collected in the first reaction region to the third reaction region.

In accordance with yet another aspect of the present disclosure, a method of forming a film by using an Atomic Layer Deposition (ALD) includes the following operations. A wafer is placed in a first reaction region, and a first gas is supplied onto the wafer so that the first gas is absorbed on a surface of the wafer. The wafer on which the first gas is absorbed is transferred to a second reaction region. A second gas is supplied onto the wafer in the second reaction region so that the absorbed first gas and the second gas react to form a first layer of a compound. The wafer on which the first layer of a compound is formed is transferred to a third reaction region. The first gas is supplied, in the third reaction region, onto the wafer on which the first layer of a compound is formed so that the first gas is absorbed on a surface of the first layer. In supplying the first gas in the third reaction region, an unused first gas that is supplied and not used in the first reaction region is supplied in the third reaction region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for processing a wafer comprising:
    a vacuum chamber divided into at least three reaction regions including a first reaction region, a second reaction region and a third reaction region arranged in order, wherein the second reaction region is located after the first reaction region in a direction of wafer transfer, wherein the third reaction region is located after the second reaction region in the direction of wafer transfer, and wherein each reaction region is configured to receive the wafer;
    a first gas source for supplying a first gas to the first reaction region via a first gas pipe;
    a second gas source for supplying a second gas to the second reaction region via a second gas pipe;
    a reuse gas pipe connected between a gas suction port of the first reaction region and a first gas injection port of the third reaction region after the first reaction region in the direction of wafer transfer, wherein the reuse gas pipe provides a reuse gas transfer path that directly connects the first reaction region to the first gas injection port, for supplying an unused first gas, evacuated via the gas suction port from the first reaction region, to the first gas injection port of the third reaction region, wherein the reuse gas transfer path is in the direction of wafer transfer to feed forward the unused first gas to the third reaction region; and
    a second gas injection port connected to the first gas pipe and configured for supplying the first gas to the wafer in the first reaction region,
    wherein the second gas injection port and the gas suction port are located on a same side of the wafer, and
    the unused first gas goes only through the reuse gas transfer path that does not go through the first gas source.

2. The apparatus of claim 1, further comprising a third gas source for supplying a non-reactive gas between the first reaction region and the second reaction region and between the second reaction region and the third reaction region to provide a gas curtain between respective reaction regions.

3. The apparatus of claim 1, wherein the first gas is supplied when the wafer is located in the first reaction region, and wherein the first gas is configured to flow over a top surface of the wafer and essentially parallel to the top surface of the wafer.

4. The apparatus of claim 1, wherein the second gas injection port is located at a first end of the first reaction region and the gas suction port is located at a second end of the first reaction region, and wherein the first gas is configured to flow over a top surface of the wafer from the first end to the second end along the direction of wafer transfer.

5. The apparatus of claim 4, wherein the second gas injection port is configured to produce an angle of a gas flow of the first gas in the first reaction region that is less than 20 degrees with respect to the top surface of the wafer.

6. The apparatus of claim 1, further comprising a wafer transporter for transferring the wafer from the first reaction region to the third reaction region via the second reaction region.

7. The apparatus of claim 6, wherein the wafer transporter includes at least one of a robot, a conveyer, and a spin-wheel.

8. The apparatus of claim 6, wherein the wafer transporter includes a spin-wheel.

9. The apparatus of claim 1, wherein the first gas injection port is connected to:
the reuse gas pipe to receive the unused first gas;
to a first end of a third gas pipe that is connected from a second end to the first gas source to receive a fresh first gas via the third gas pipe; and
to the third reaction region, wherein the first gas injection port is configured to combine the unused first gas and the fresh first gas and to supply the combination to the third reaction region.

10. The apparatus of claim 1, wherein the unused first gas is supplied to the third reaction region only through the reuse gas pipe.

11. An apparatus for processing a wafer comprising:
a vacuum chamber divided into a plurality of reaction regions including a first reaction region, a second reaction region and a third reaction region, the plurality of reaction regions being located on a circumference of a circle arranged in order, wherein the second reaction region is located after the first reaction region in a direction of wafer transfer, and wherein the third reaction region is located after the second reaction region in the direction of wafer transfer, and wherein each reaction region is configured to receive the wafer;
a first gas source for supplying a first gas to the first reaction region via a first gas pipe;
a second gas source for supplying a second gas to the second reaction region via a second gas pipe;
a reuse gas pipe connected between a gas suction port of the first reaction region and a first gas injection port of the third reaction region after the first reaction region in the direction of wafer transfer, wherein the reuse gas pipe provides a reuse gas transfer path that directly connects the first reaction region to the first gas injection port, for supplying an unused first gas, evacuated via the gas suction port from the first reaction region, to the first gas injection port of the third reaction region, wherein the reuse gas transfer path is in the direction of wafer transfer to feed forward the unused first gas to the third reaction region; and
a second gas injection port connected to the first gas pipe and configured for supplying the first gas to the wafer in the first reaction region,
wherein the second gas injection port and the gas suction port are located on a same side of the wafer, and
the unused first gas goes only through the reuse gas transfer path that does not go through the first gas source.

12. The apparatus of claim 11, further comprising a third gas source for supplying a non-reactive gas between the first reaction region and the second reaction region and between the second reaction region and the third reaction region.

13. The apparatus of claim 11, wherein the first gas is provided to the first reaction region when the wafer is located in the first reaction region.

14. The apparatus of claim 11, further comprising a wafer transporter for transferring the wafer from the first reaction region to the third reaction region via the second reaction region.

15. The apparatus of claim 14, wherein the wafer transporter includes at least one of a robot, a conveyer, and a spin-wheel.

16. The apparatus of claim 14, wherein the wafer transporter includes a conveyer.

17. The apparatus of claim 11, wherein the first gas injection port is connected to:
the reuse gas pipe to receive the unused first gas;
to a first end of a third gas pipe that is connected from a second end to the first gas source to receive a fresh first gas via the third gas pipe; and
to the third reaction region, wherein the first gas injection port is configured to combine the unused first gas and the fresh first gas and to supply the combination to the third reaction region.

18. An apparatus for processing a wafer, comprising:
a vacuum chamber divided into at least three reaction regions including a first reaction region, a second reaction region and a third reaction region arranged in order, wherein the second reaction region is located after the first reaction region in a direction of wafer transfer, and wherein the third reaction region is located after the second reaction region in the direction of wafer transfer, and wherein each reaction region is configured to receive the wafer;
a first gas source for supplying a first gas to the first reaction region via a first gas pipe;
a second gas source for supplying a second gas to the second reaction region via a second gas pipe; and
a reuse gas pipe connected between a gas suction port of the first reaction region and a first gas injection port of the third reaction region after the first reaction region in the direction of wafer transfer, wherein a second gas injection port is located at a first end of the first reaction region and is connected to the first gas pipe for supplying the first gas to the first reaction region, wherein the reuse gas pipe provides a reuse gas transfer path, that directly connects the first reaction region to the first gas injection port without going back to the first gas source, for supplying an unused first gas, evacuated via the gas suction port from the first reaction region, wherein the reuse gas transfer path provides to feed forward direction for the unused first gas to the third reaction region, wherein the unused first gas in the reuse gas pipe and a fresh first gas of the first gas pipe are combined at the first gas injection port of the third reaction region that is located after the first reaction region in the direction of wafer transfer and the combination of the unused first gas and the fresh first gas is supplied to the third reaction region, and wherein the second gas injection port and the gas suction port are located on a same side of the wafer.

19. The apparatus of claim 18, further comprising a wafer transporter for transferring the wafer from the first reaction region to the third reaction region via the second reaction region.

20. The apparatus of claim 19, wherein the wafer transporter includes at least one of a robot, a conveyer, and a spin-wheel.

* * * * *